US006332032B1

United States Patent
Michael et al.

(10) Patent No.: US 6,332,032 B1
(45) Date of Patent: Dec. 18, 2001

(54) METHOD FOR GENERATING TEST FILES FROM SCANNED TEST VECTOR PATTERN DRAWINGS

(75) Inventors: Gerald T. Michael, Ocean, NJ (US); Wei Su, Staten Island, NY (US); Michael A. Dukes, Wimberley, TX (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 0 days.

(21) Appl. No.: 09/210,529

(22) Filed: Dec. 3, 1998

(51) Int. Cl.$^7$ .................................................. G06K 9/62
(52) U.S. Cl. ..................... 382/113; 382/176; 702/119; 703/14; 707/502
(58) Field of Search ................................. 352/100, 112, 352/113, 141, 145, 176, 173, 275, 292, 305, 306; 358/1.18; 707/502; 348/188; 438/11, 17; 703/15, 14, 16; 702/68, 119, 120, 126

(56) References Cited

U.S. PATENT DOCUMENTS

| | | | |
|---|---|---|---|
| 4,541,114 | 9/1985 | Rutenbar et al. | 382/8 |
| 4,559,644 * | 12/1985 | Kataoka et al. | 382/9 |
| 4,791,586 | 12/1988 | Maeda et al. | 364/491 |
| 4,949,388 | 8/1990 | Bhaskaran | 382/10 |
| 4,984,279 | 1/1991 | Kidney et al. | 382/1 |
| 5,222,158 | 6/1993 | Takasaki et al. | 382/44 |
| 5,251,268 | 10/1993 | Colley et al. | 382/14 |
| 5,325,441 | 6/1994 | Hoecker | 382/1 |
| 5,467,411 | 11/1995 | Tanaka et al. | 382/113 |
| 5,568,397 | 10/1996 | Yamashita et al. | 364/491 |
| 5,572,437 | 11/1996 | Rostoker et al. | 364/489 |
| 5,832,415 * | 11/1998 | Wilkening et al. | 702/86 |
| 5,918,192 * | 7/1999 | Tomaszewski | 702/85 |
| 6,134,338 * | 10/2000 | Solberg et al. | 382/113 |

OTHER PUBLICATIONS

Shinya Inoue, Video Microscopy, Plenum Press, ISBN 0–306–42120–8, pp. 26.*
Medhat Kirma et al., From Paper Drawings to Computer–Aided Design, IEEE Computer Graphics and Applications, vol. 5, No. 2, Feb. 1985, pp. 27–39.*
Millham E. et al, "Automatic VLSI Test Equipment", VLSI Handbook, Chapter 10, McGraw–Hill, 1989; pp. 10.1–10.21.
Hepler, E.L., "Simulation", VLSI Handbook, Chapter 18, McGraw–Hill, 1989; pp. 18.1–18.12.
Nagy, G., "At the Frontiers of OCR", Proceedings of the IEEE, V. 80, n. 7, pp. 1093–1100, Jul. 1992;.

(List continued on next page.)

Primary Examiner—Leo Boudreau
Assistant Examiner—Brian P. Werner
(74) Attorney, Agent, or Firm—Michael Zelenka; John M. O'Meara

(57) ABSTRACT

A graphical bitmap image of a scanned test pattern drawing is transformed into a test file in a file format that is readily usable to provide stimuli for computer-aided design (CAD) tools or integrated circuit (IC) testing equipment. A bitmap image of each page of the test pattern drawing is produced as a graphical image of the rows and columns of test pattern data. Non-essential drawing symbols are then removed from the bitmap image, such as the lines used to draw the table. Essential test pattern information is recognized and is converted into a machine readable format by first storing the data in a tabular format having rows and columns which correspond to the rows and columns of the test pattern drawing. The stored test pattern data is then integrated with a machine readable file format which is adaptable to the CAD and IC tool in order to produce the machine readable test file.

27 Claims, 5 Drawing Sheets

OTHER PUBLICATIONS

Mori, E. et al, "Historical Review of OCR Research and Development", Proceedings of the IEEE, pp. 1029–1058, V. 80 N. 7, Jul. 1992.

Yu, B.et al, "An Economical Contour Extraction Alrorithm for Understanding Large–size Engineering Drawings", IEEE, pp. 302–309, 1990.

Luenberger, Introduction to Dynamics Systems, pp. 225–244, John Wiley and Sons, 1979.

Pelz, G. et al., "Circuit Comparison by Hierarchical Pattern Matching", IEEE, pp. 290–293, Nov. 1991.

Shi, Z. et al., "A New Input Method for CAD—Automatical Read–In Technique of Paper Drawings", IEEE, pp. 431–433, Jun. 1991.

Maderlechner, G. et al., "Representation, Classification and Modelling of Graphs for Efficient Pattern Recognition in line Images", IEEE, pp. 678–680, Nov. 1988.

* cited by examiner

FIG. 1

| | | | 103 | 104 | 106 | 108 | 110 | 112 | 114 | 116 |
|---|---|---|---|---|---|---|---|---|---|---|
| R LEG | 36 | | 1 | | | 0 | | | | | 1 |
| RST SW | 18B | | x | | | | | | | | x |
| P MAX | 40 | | 1 | | | | | | | | 1 |
| SENS | 8 | | 0 | | | | | | | | 0 |
| PBN | 4 | | 1 | | | | | | | | 1 |
| P4N | 3 | | 1 | | | | | | | | 1 |
| P2N | 5 | | 1 | | | | | | | | 1 |
| P1N | 1 | | 1 | | | | | | | | 1 |
| RR 7 | 24 | | 0 | 0 | 0 | 0 | 0 | 0 | | | 0 |
| RR 6 | 25 | | 0 | 0 | 0 | 0 | 0 | 0 | | | 0 |
| RR 5 | 27 | | 0 | 0 | 0 | 0 | 0 | 0 | | | 0 |
| RR 4 | 28 | | 0 | 0 | 0 | 0 | 0 | 0 | | | 0 |
| RR 3 | 29 | | 0 | 0 | 0 | 0 | 0 | 0 | | | 0 |
| RR 2 | 30 | | 1 | 1 | 1 | 0 | 0 | 0 | | | 0 |
| RR 1 | 31 | | 1 | 0 | 0 | 1 | 1 | 0 | | | 0 |
| PR 3 | 38 | | 0 | | | 0 | | | 0 | 0 | 1 | 1 |
| PR 2 | 37 | | 0 | | | 0 | | | 0 | 1 | 0 | 1 |
| PR 1 | 35 | | 0 | | | 0 | | | 0 | 1 | 0 | 1 |
| PH SEN | 20 | | 0 | | | 0 | | | 0 | 1 | 0 | 1 |
| L LIMN | 39 | | 1 | | 1 | 0 | 0 | 1 | 1 | 1 | 1 | 1 |
| LINE NO. | | | 103 | 104 | 106 | 108 | 110 | 112 | 114 | | 116 |
| TEST | | | | | T | T | T | T | T | | T |
| FINE | 7 | | 0 | | | | | | | | 0 |
| P5U1D | 2 | | 1 | | | | | | | | 1 |
| ENP SIG | 6 | | 0 | | | | | | | | 0 |
| ENP CTR | 9 | | 0 | | | | | | | | 0 |
| L CMD | 11 | | 1 | | | | | | | | 1 |
| MOD SAMPN | 12 | | 0 | | | | | | | | 0 |
| PULSE I | 10 | | 0 | | | | | | | | 0 |
| R LEG FF | 14 | | 1 | | 1 | 0 | | | | | 0 |
| SET DIR | 13 | | 0 | | | | | | | | 0 |
| EXEC | 17 | | 0 | | | | | | | | 0 |
| HOME | 15 | | 0 | | | | | | | | 0 |
| CRSE | 16 | | 1 | | | | | | | | 1 |
| EX DISN | 34 | | 0 | 1 | 0 | 1 | 1 | 1 | 1 | 0 | 1 | 0 | 1 | 0 | 1 |
| DIR | 33 | | 0 | | | 0 | 0 | 0 | 1 | | | 1 |
| PR CTR | 32 | | 0 | | | 0 | 1 | 0 | | | | 0 |
| B3N | 21 | | 1 | | | | | | | | 1 |
| B2N | 22 | | 1 | | | | | | | | 1 |
| B1N | 23 | | 1 | | | | | | | | 1 |
| PRC70 | 18A | | 0 | | | | | | | | 0 |

FIG. 2

| | Signal | Bit | | 204 | 205 | 206 | 207 | 208 | 209 | 210 | 211 | 212 | 213 | 214 | 215 | 216 | 217 | 218 | 219 | 220 | 221 | 222 | 223 |
|---|---|---|---|---|---|---|---|---|---|---|---|---|---|---|---|---|---|---|---|---|---|---|---|
| OUTPUTS | NORMAL | 38 | 0 | | | | | | | | | | | | | | | | | | | | 0 |
| | TUNE | 37 | 0 | | | | | | | | | | | | | | | | | | | | 0 |
| | HOLD | 34 | 0 | | | 0 | 1 | 0 | | | | | | | | | | | | | | | 0 |
| | CASE | 33 | 0 | | | | | | | | 0 | 1 | 1 | | | | | | | | | | 1 |
| | EX DIS N | 32 | 1 | | | | | | | | | | | | | | 1 | 0 | | | | | 0 |
| | SET DIR | 31 | 0 | | | | | | | | | 0 | 1 | 1 | 0 | | | | | | | | 0 |
| | SWENAN | 25 | 1 | | | | | | | | | | | | | | | | | | | | 1 |
| | RST PUL | 24 | 1 | | | | | | | | | | | | | | 1 | 0 | 0 | 0 | 0 | 0 | |
| | EXEC | 23 | 0 | | | | | | | | | | | | | | | | | | | | 0 |
| | ENP CTR | 22 | 0 | | | | | | | | | | | | | | | | | | | | 0 |
| | LCMD | 21 | 0 | | | | | | | | | 0 | 1 | 1 | 0 | | | | | | | | 0 |
| | ENPSIG | 19 | 1 | | | | | 1 | 0 | | | | | | | | | | | 0 | 0 | 0 | 0 |
| | R(-)N | 18 | 1 | | | | | | | | | | | | | 1 | 0 | 0 | 0 | 0 | 0 | 0 | |
| | R(+)N | 17 | 1 | | | | | | | | | 1 | 0 | 0 | 0 | 0 | 0 | 0 | 1 | 1 | 1 | 1 | 1 |
| | PUL DIR | 16 | 1 | | | | | | | | | | | | | 1 | 0 | 0 | 0 | 0 | 0 | 0 | |
| | MOD SAMP N | 15 | 1 | | | | | 1 | 0 | 1 | 1 | | | | | | | | | | | | 1 |
| | PR CTR | 14 | 1 | 1 | 0 | | | | | | | | | | | | | | | | | | 0 |
| | RLEGFF | 13 | 1 | | | | | | | | | | | | | | | | | | | | 1 |
| | FINE | 12 | 0 | | | | | | | | | | | | | | | | | | | | 0 |
| | HOME | 10 | 1 | 1 | 0 | | | | | | | | | | | | | | | | | | 0 |
| | DIR | 8 | 1 | | | | | | | | | | | | | | | | | | | | 1 |
| | LINE NO. | | | 204 | 205 | 206 | 207 | 208 | 209 | 210 | 211 | 212 | 213 | 214 | 215 | 216 | 217 | 218 | 219 | 220 | 221 | 222 | 223 |
| | TEST | 26 | | REPEAT 45 | T | T | T | T | T | T | T | T | T | T | T | T | T | T | T | T | T | T | T |
| INPUTS TEST WORD | LLIMN | 36 | 1 | | | | | | | | | | | | | | | | | | | | 1 |
| | NO TUNE | 35 | 0 | | | 0 | 1 | 0 | | | | | | | | | | | | | | | 0 |
| | SW HOLD N | 30 | 1 | | | | | | | | | | | | | | | | | | | | 1 |
| | EX HOLD N | 29 | 1 | | | | | | | | | | | | | | | | | | | | 1 |
| | CLOCK | 27 | 0 | 1 | 1 | 1 | 1 | 0 | 1 | 0 | 1 | 1 | 0 | 0 | 1 | 0 | 1 | 0 | 1 | 1 | 1 | 1 | 0 |
| | RST SW | 26 | 0 | | | | | | | | | | | | | | | | | | | | 0 |
| | P MAX | 20 | 0 | | | | | | | | | 0 | 1 | | | | | | | | | | 1 |
| | TC1 | 11 | 1 | | | | 1 | 0 | | | | | | 0 | 1 | | | | | | | | 1 |
| | FCH FNN | 9 | 1 | | | | | | | | | | | | | | | | | | | | 1 |
| | TUN RST | 7 | 0 | | | | | | | | | | | | | | | | | | | | 0 |
| | PLT | 6 | 0 | | | | | | | | | | | | | | | | | | | | 0 |
| | PCT | 5 | 0 | | | | | | | | | | | | | | | | | | | | 0 |
| | VHF HI | 4 | 1 | | | | | | | | | | | | | | | | | | | | 1 |
| | RLT | 2 | 1 | 1 | 0 | | | | | | | | | | | | | | | | | | 0 |
| | RGT | 1 | 0 | | | | | | | | | | | | | | | | | | | 0 | 1 | 1 |

01110001000100100010HLLLLHHLLLLLHHHHLHXH
01110011000100100010HLLLLLHLLLLLHHHHLHXH
01110001000100100010HLLLLLHLLLLLHHHHLHXH
01110011000100100010HLLLLHLLLLLLHHHHLHXL
01110011000000100010LLLLLHLLLLLLHHHHLHXL
01111011000000100010LLLLLLLLLLLLHHHHLHXL
01110011000000100010LLLLLLLLLLLLHHHHLHXL
01110111000000100010HLLLLLLLLLLLHHHHLHXL
01110101000000100010HLLLLLLLLLLLHHHHLHXL
01110111000000100010HLHLLLLLLLLLHHHHLHXL
01110101000000100010HLHLLLLLLLLLHHHHLHXL
01110111000000100010HLHLLLLLLLLLHHHHLHXL
01110101000000100010HLHLHLLLLLLLHHHHLHXL
01110111000000100010HHLHHLLLLLLLHHHHLHXH
```

METHOD FOR GENERATING TEST FILES FROM SCANNED TEST VECTOR PATTERN DRAWINGS

RELATED APPLICATION

The present invention is related to Ser. No. 08/506,943; "Method for Generating Computer Aided Design Programming Circuit Designs from Scanned Images of the Design", filed Jul. 26, 1995, by the inventors herein and partially assigned to the same assignee.

GOVERNMENT INTEREST

The invention described herein may be manufactured, used, imported, sold, and licensed by or for the Government of the United States of America without the payment to us of any royalty thereon.

BACKGROUND OF THE INVENTION

1. Field of the Invention

The present invention relates to the fields of electronic circuit design and testing. In particular, the present invention relates to the automatic conversion of test pattern drawings of electrical circuits into test files which can be used as direct input to computer-aided design (CAD) tools or integrated circuit (IC) testing equipment.

2. Background of the Invention

Currently, the Department of Defense (DoD) maintains a large inventory of documentation for electronic systems. The existing documentation is in the form of circuit drawings, test pattern drawings, and associated information. Many of these documents have already been scanned and are stored as scanned image files. However, these files are only abstract representations of circuits, and as such cannot be directly used as input to computer-aided design (CAD) tools or integrated circuit (IC) testers. In order to re-specify or re-manufacture an electronic part, board, or system, a considerable amount of time and human effort must be expended to collect and understand the circuit information, such as inputs and outputs, from the circuit drawing. In order to ensure that the re-designed device is functioning correctly, the test pattern drawings, which specify the response to stimulus expected of electronic circuits, must also be converted into a form that can be used for simulation and IC testing.

The ability to re-specify and re-manufacture circuits is essential for DoD and industry to efficiently and automatically maintain and upgrade system electronics. This ability particularly affects those organizations concerned with building and maintaining fleets of high-cost, long-lived electronic-dependent systems facing the same problems associated with maintaining proper documentation, continuous upgrades, the obsolescence of commercial integrated circuit (IC) technology, and document storage and retrieval.

The term "test pattern drawing" is defined as a document, such as a test word truth table, specifying testing characteristics of a given circuit or component, rather than a drawing in the pictorial sense. For example, a typical test pattern drawing is composed of multiple pages where each page contains test pattern information and data arranged in a tabular format of rows and columns. This format is defined as the "test word truth table" drawing, and it is important to recognize that no schematic or drawing in the conventional pictorial sense is provided. These definitions apply in conjunction with any other commonly accepted definitions of these terms.

A test pattern drawing describes a properly functioning IC by listing the input patterns, or test words, supplied to the IC being tested and the corresponding output patterns. Other relevant information, including the pin names and/or pin numbers, test line numbers, and whether or not the output is to be tested is also typically included in the drawing. The information contained in a test pattern drawing is only intelligible to a trained human observer who first interprets the information content of the drawing based on specialized knowledge and experience and then manually enters the test pattern information as needed in CAD tools or IC testers.

A complete set of test patterns, even for a simple device, will generally consist of a number of drawing pages. The drawing set for test patterns alone can become especially large for complicated devices which typically require over 250,000 test vectors. Therefore, the productivity improvement in automating this manual process for circuit and board re-design and re-engineering is particularly significant.

Until now there has been no cost-effective, automatic way to convert the test information from the "test word truth table" of a test pattern drawing into a machine-readable data file format. There has been no method that accurately reproduces the necessary input and output information in CAD format to readily replicate the equipment's test parameters without human intervention.

Therefore, there is a long-felt need in the art to automatically convert test pattern data from a "test word truth table" into a machine-readable format, such as a specially formatted text file. Such a file can be used by a CAD tool to provide input stimulus to a simulation model to check the model's responses and verify that the model is providing the correct outputs. Similarly, such a machine-readable file can be used by IC testing equipment to generate input stimuli to the IC's input pins and to check the output observed at the IC's output pins to verify that the physical device is functioning properly. The present invention addresses this need for efficient and cost-effective methods suitable for use with CAD technology.

SUMMARY OF THE INVENTION

A general object of the present invention is to provide a method for directly and automatically importing the information contained in the test word truth table of a test pattern drawing into a computer-aided design (CAD) tool. This information can then provide stimuli to a CAD model without human intervention for the understanding of the drawing and without an operator using the CAD tool design entry features to manually enter the test pattern information into the required input format of the CAD tool.

Another object of the present invention is to provide a method for directly and automatically importing the information contained in a test pattern drawing into integrated circuit (IC) testing equipment. This information can then provide stimuli to an IC being tested without having to manually enter the test pattern information into the required input format of the IC tester.

These and other objects are accomplished by the following steps to convert a test word truth table of a test pattern drawing into a machine readable file format for use by electronic computer aided design software tools and by integrated circuit test equipment. These steps include scanning the test word truth table of a test pattern drawing; producing a graphical bitmap image of the scanned test pattern drawing; locating and removing non-essential test pattern data; recognizing the essential test pattern information from the bitmap image; storing the desired data in tabular format; integrating the stored test path data into a machine-readable format; and converting the recognized test pattern data into a machine-readable test file.

The present invention therefore provides a method for effectively converting the test word truth table in test pattern drawings, which contain essential information for parts re-design and re-procurement, into a usable format for CAD tools and IC testers. The advantages of the present invention can be further appreciated in view of a related application, Ser. No. 08/506,943, "Method for Generating Computer Aided Design Programming Circuit Designs from Scanned Images of the Design", filed Jul. 26, 1995, which is hereby incorporated by reference. In the referenced application, a method is described for transforming scanned pictorial schematic circuit drawings into a machine-readable non-pictorial description readily usable CAD input.

The present invention also includes a computer program stored in computer-readable memory, and implemented by a general-purpose computer.

BRIEF DESCRIPTION OF THE DRAWINGS

These and other features of the invention will be better understood in light of the following Detailed Description of the Invention and the attached drawings wherein:

FIGS. 1, 2, and 3 are illustrations of typical test pattern drawings before being converted into machine-readable test vector files by the present invention;

All like reference numerals identify the same element of the present invention.

DETAILED DESCRIPTION OF THE PREFERRED EMBODIMENTS

Figure 4:
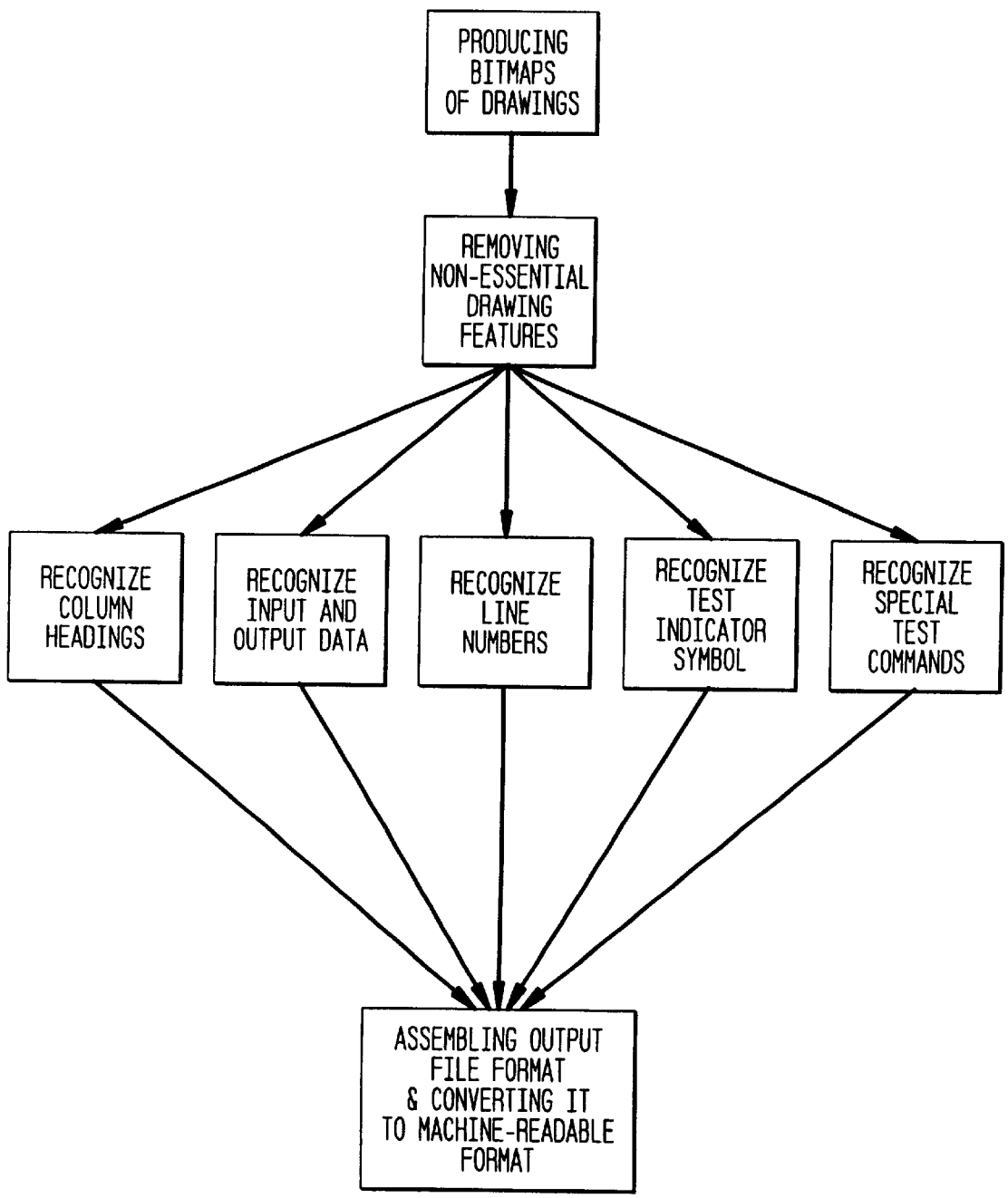
FIG. 4 is a flow diagram of the method according to the present invention.

A typical test pattern drawing is composed of multiple pages with each page containing test pattern information and data arranged in a tabular format of rows and columns. This format has been defined as the test word truth table drawing, and it is noted that no schematic or drawing in the conventional pictorial sense is provided. Examples of typical test pattern drawings are presented in FIGS. 1, 2, and 3. As shown in FIG. 1, test input data 20 is on the left side of the table and expected output data 21 is on the right side of the table. Vertically, all of the entries apply to a single pin of an integrated circuit chip, or in the case of special column headings, contain test instructions. Horizontally, all of the entries apply to a single test word or test pattern. The pin numbers 22 and pin names 23 are typically indicated at the top of each column. The line numbers 24 indicate the sequence for application of the test patterns to an integrated circuit chip.

Patterns where the output is to be tested and verified are typically indicated by a test indicator symbol 25 such as a letter "T" in a special column typically labeled "TEST." Special test commands are also included in the table. For example, as shown in FIGS. 2 and 3, sets of test patterns that are repeated are indicated by a repeat test instruction 26 which includes a bracket, a text label for the test instruction (e.g., "REPEAT"), and a number indicating the number of times to repeat the set. A "T" in the "TEST" column for a repeated set of patterns indicates a test at the end of the application of the repeated pattern.

FIG. 4 shows a flow diagram of the method of the present invention. The method includes the steps of producing a bitmap image of a scanned test pattern drawing, then locating and removing non-essential drawing symbols and features, such as the lines that are used to draw the table. The method recognizes essential test pattern data and information from the bitmap image of the test pattern drawing; and converts the recognized essential test pattern data and information into a machine-readable test file which can be used as direct input to CAD tools or IC testing equipment.

For a better understanding the method steps of the present invention shown in FIG. 4, the detailed description of each of the steps is provided below with numerous cross references to the test pattern drawings shown in FIGS. 1, 2, and 3.

The first step of the method includes producing a bitmap image of each page of the test pattern drawing. A standard commercial scanning device is first used to scan the paper test pattern drawing, (in this case, a test word truth table), to produce a digitized image file, which is typically in hexadecimal code. The image file is converted to a black and white bitmap, where each binary bit of the bitmap represents a picture element (pixel) having one of two states, either a logical "0" value for a white pixel or a logical "1" value for a black pixel. Because the bitmap is merely a graphical reproduction of the test pattern drawing, further manipulation is therefore required to transform the information in the test pattern drawing into a format that can be directly used as input to CAD and IC testing tools.

Another step involves locating and removing the non-essential drawing features. These non-essential drawing features include the horizontal and vertical lines used to draw the data table, referred to hereinafter as table lines 27 (FIGS. 1, 2, and 3). Table lines 27 are used to separate parts of the drawing into regions, and can be as simple as those in FIG. 1 which separate the header information from the test patterns, or as extensive as those in FIG. 2 which separate each of the columns of data.

Table lines 27 are generally used as a manual aid in understanding and visually lining up the columns and rows. As such, table lines in general provide no additional information that must be captured in the output file. Consequently, table lines of any test pattern drawing can be removed by identifying the lines and replacing the black pixels with white pixels. Alternatively, table lines can be removed by identifying the table lines and programming the software of the present invention to ignore them in each succeeding step. This software is stored in a computer readable memory, and is implemented by running the software of the present invention on a general-purpose computer.

As shown in FIGS. 1, 2, and 3, table lines 27 span the length or width of the table in a manner that makes them easy to separate from the information contained in the drawing. Moreover, searching for table lines within the bitmap image of test pattern drawings need only be done in the horizontal and vertical directions since table lines typically extend either horizontally or vertically. Table lines can also be differentiated and separated from other drawing features such as vertical "no change in signal" lines which are used within the data table to show that there is no change in signal values for a range of test patterns. Illustratively, in FIGS. 1 and 3, vertical "no change in signal" lines 30 terminate on test pattern data whereas table lines 27 (FIGS. 1, 2, and 3) terminate on other table lines or at the edges of the drawing area, thereby facilitating the differentiation between the two types of lines.

There are a number of methods known in the art for recognizing horizontal and vertical lines. The specific method selected is not critical, but rather it is only important that the lines can be recognized and removed by the selected method. The table lines can be removed by simply changing the value of the pixels that make up the line from black to white. For drawings like those in FIGS. 1 and 3, an additional step of removing the vertical "no change in signal" lines 30 will also facilitate a more effective process for locating and recognizing the other essential test pattern drawing features.

Referring again to the steps shown in FIG. 4, the essential test pattern data in the test pattern drawing is recognized in the graphical bitmap image by locating and identifying the following types of information:

(1) Column headings, which include circuit pin identification data such as pin names and/or pin numbers as well as any special column headings;

(2) Input and output data for the test patterns;

(3) Line numbers, each of which corresponds to a particular test pattern (e.g., row of test pattern data);

(4) Test indicator symbols, which identify the output data to be verified by the computer-aided design or integrated circuit testing tool; and (5) Special test commands, such as repeat test commands, which identify special instructions for applying the test patterns. For example, repeat test commands are used to identify those tagged test patterns that are repeated in a test sequence.

In the present invention, the essential test pattern data is recognized using character and symbol recognition software and algorithms known to those skilled in the art. Examples of known methods are described in "Omnidocument Technologies,"by Bokser, *Proceedings of the IEEE*, Vol. 80, No. 7, July 1992, pp. 1066–1078; "Segmentation Methods for Character Recognition: From Segmentation to Document Structure Analysis," by Fujisawa et al., *Proceedings of the IEEE*, Vol. 80, No. 7, July 1992, pp. 1079–1092; "Handwritten Alphanumeric Character Recognition by the Neocognitron," by Fukushima et al., *IEEE Transactions on Neural Networks*, May 1991; "Historical Development of OCR Research and Development," by Mori et al., *Proceedings of the IEEE*, Vol. 80, No. 7, July 1992, pp. 1029–1058; "At the Frontiers of OCR," by Nagy, *Proceedings of the IEEE*, Vol. 80, No. 7, July 1992, pp. 1093–1100; and "Computer Recognition of Unconstrained Handwritten Numerals," by Suen et al., *Proceedings of the IEEE*, Vol. 80, No. 7, July 1992, pp. 1162–1180.

As the essential test pattern data is located and identified in the bitmap image of the test pattern drawing, information for each of the recognized symbols is stored for later use. Specifically, the symbol itself is stored along with location information which is needed to ensure that the data in the output file is ordered in the same manner as the data in the original test pattern drawing.

As shown in FIG. 1, column headings in test pattern drawings typically include the integrated circuit pin numbers 22 and/or the pin names 23 as well as any labels for special columns used in the drawing. The pin numbers 22 and/or the pin names 23 are typically located at the top of the table. In the present invention, column headings and their respective locations in the drawing are identified using character recognition methods known in the art as previously described.

The integrated circuit pin identification data is used in subsequent steps to ensure that the CAD simulation or IC tester correctly identifies the columns in the test vector file that is produced. Referring again to FIG. 1, labels for special columns, such as the "LINE NUMBER" heading and "TEST" heading, are also located and identified in this step of the process. The entries in the table under the "TEST" heading include test indicator symbol 25 which is used to identify those test patterns where the output data is to be verified by the CAD simulator or the IC tester. The entries under the "LINE NUMBER" heading represent the order in which the test patterns are to be applied and are used in the present method to ensure that the test vectors are placed in the output file in the correct order.

The input and output data, 20 and 21 respectively, and their corresponding location in the bitmap image are located and identified in another recognition step in the process. As illustrated in FIG. 1, the input data 20 and output data 21 are arranged in rows and columns to correspond to the respective integrated circuit pin numbers/names and their locations in the test pattern drawing. Typically, there is a limited range of possible values for the input and output data used in test pattern drawings. Most commonly, the only symbols used to represent these values are "0", "1", "X", and vertical "no change in signal" lines. The "0", "1", "X"symbols can be recognized by a suitable character recognition method known in the art in the same manner as previously described. Moreover, character recognition of input and output data is simplified by the fact that there is a more limited set of values, and therefore, one only needs to distinguish among the few possible values after a symbol is located.

As shown in FIGS. 1, 2 and 3, when the input value (i.e., stimulus) or the expected output value (i.e., response) for a given pin does not change over a range of test patterns, the symbol for the particular value (e.g., "0") is placed at both ends of the range. Then either a vertical "no change in signal" line 30 (FIGS. 1 and 3) or a blank space (see FIG. 2) is placed across that pin's position in the intervening locations within the test patterns. The vertical "no change in signal" lines represent that the value is unchanged through a range of entries starting with the value at the top of the vertical line and ending with the value at the bottom of the vertical line.

Because the locations of the 0, 1, and X symbols are saved after being previously located and identified, reconciling the missing data entries represented by either the vertical "no change in signal" lines or blank spaces can be readily accomplished in the present invention. Specifically, the input and output data symbols and corresponding location information are stored after being located and identified. Then, the physical boundaries of the test pattern data in the bitmap image are identified, the missing entries are identified within the rows and columns of the test pattern data, and the missing entries are reconciled.

Several options are available for reconciling the missing entries. These options include entering the intervening values in subsequent steps (i.e., back-filling), leaving the entries blank, or otherwise handling the intervening values in accordance with any particular requirements warranted by the specified output file format. Although it is possible to explicitly recognize the vertical lines in drawings that include them, it is not essential for this step.

Referring again to FIG. 4, another step in the method of the present invention is to locate and identify line numbers that represent the sequence in which the test patterns are applied. Specifically, each line number corresponds to a row of test pattern data that represents a single test word or test pattern. As shown in FIG. 1, each line of test patterns in the table is consecutively numbered from the beginning to the end of the table with a line number 24. Line numbers are essential because they are used to ensure that the drawings that make up the complete set of test patterns are assembled in the proper order. Although each line of test pattern data does not always have an associated line number printed on the test pattern drawing, there are typically enough line numbers in the drawing for the missing line numbers to be identified.

Referring again to FIG. 4, another step in recognizing the essential test pattern data is locating and identifying a test indicator symbol. As illustrated in FIG. 1, the test indicator symbol 25 is usually represented by the letter "T" in a special column typically labeled "TEST." The test indicator symbol 25 marks the lines whose output is to be tested and verified either in the CAD simulation or by the IC tester.

In accordance with the present invention, the "TEST" column will display either a "T" or a blank space. This is an instruction to the test program, either a CAD program or IC test equipment, to verify that the output specified by the test pattern drawing was actually observed at the output pins. If the specified output matches the observed output, then the test is passed. Otherwise the test is considered a failure.

When the "TEST" column is blank, only the line 13 input is present, which indicates that the device is being set up for the next test. In this case, there is no comparison of actual and expected output. A successful test is achieved for the device, either CAD simulation or using IC test equipment, when the observed outputs match the outputs specified in the test pattern drawing for every line displaying a "T" in the "TEST" column.

Special test commands are also located and identified in the bitmap image of the test pattern drawings as shown in FIG. 4. For example, a repeat test command 26 shown in FIGS. 2 and 3 is used to identify test patterns that are to be repeated a specified number of times, rather than reproducing the lines in the test pattern drawing. Consequently, the repeat test command 26 is linked to at least one line number corresponding to the row of test pattern data to be repeated. This is typically the only item in the test pattern drawing for which there are a number of acceptable locations.

FIG. 2 depicts a typical repeat test command 26 which includes a bracket symbol having a center point and a pair of end points which are used to mark the lines to be repeated. The bracket symbol can be easily recognized by differentiating between symbol sizes, because the bracket symbol is larger relative to all of the other symbols used in the drawing. Alternatively, in another embodiment, the bracket symbol can be recognized as a last step by examining only the symbols that remain after all of the other symbols have been recognized (i.e., located and identified in previous steps) and their pixel values changed from "black" to "white."

After the bracket symbol is located and identified, the location of the end points of the bracket are identified and used in conjunction with the line number location information to determine which sets of test patterns are included by the bracket. The center point on the bracket symbol will point toward the specific instructions to be applied to the line numbers enclosed by the bracket. These instructions typically consist of a text label (e.g., "REPEAT") and a number for the number of times the action is to be taken as shown in FIGS. 2 and 3.

The repeat test command 26 and the number of times to repeat the set of test patterns are also recognized using a suitable character recognition method as previously described. Information about the line numbers to repeat and the number of times to repeat the set of line numbers is also stored for use in the generation of the output file.

The ordering of the steps for recognizing the essential test pattern data is not critical, except as indicated for particular embodiments. The most important aspects of the present invention are the correct recognition of the various portions of the drawing and their correct re-assembly into the desired output file. Both the location information and value of each of the recognized symbols in the drawing are therefore important. The recognition and conversion process is analogous to the identification of values in a scanned table and the conversion of that table into a specified file format. In storing the recognized symbols after each symbol is located and identified, an internal representation of the recognized portions of the drawing is created and maintained until the specified output format for the test vector information is created.

As shown in FIG. 4, after all the essential test pattern information and data has been recognized in the preceding steps, the remaining step includes converting the essential test pattern data and information into a machine-readable file format. As noted above, the rows of the test pattern drawing either comprise headers (i.e., column labels) or test pattern input and output data within the data table. When viewed in a row, all of the input and output data in the same row relates to the same test pattern. The entries in any given column of the test pattern drawing either contain test instructions (e.g., in the "TEST" column), or for those columns containing input and output data, each of the columns correspond to a specific pin. Because the location of each symbol is retained, symbols with the same position relative to the left of the drawing relate to the same column, and symbols with the same position relative to the top of the drawing relate to the same row. Consequently, obtaining both the symbol identification and location information thereby facilitates the effective reproduction of the test pattern drawing.

Converting the recognized data into a machine-readable format includes the following steps: storing the recognized essential test pattern data in a tabular data format having rows and columns which correspond to the rows and columns of the test pattern data in the bitmap image; generating a machine-readable file format adaptable to the computer-aided design and integrated circuit testing tools; and integrating the stored essential test pattern data with the machine-readable file format to generate the test vector file.

Each IC tester or CAD simulation program has different file format requirements for test stimuli and expected outputs. The recognition process of the present invention provides sufficient information, (such as pin number, input and output vectors, and special instructions), so that any such test may be fully characterized. Once this information is extended from the Test Pattern drawing, and the desired IC Tester or CAD program format file is understood, it is a fairly straight forward matter to generate the tester file form the extracted information.

Generally, the machine-readable format is an ASCII file with a specific format for each line, with the required format for a specific IC Tester or CAD program being specified by the manufacturer, though in some cases the formats may be standardized. In either case, a hardware description language-based simulation, such as VHDL or Verilus, provides a user with greater flexibility in defining formats.

The essential information needed to define a format is:
(1) Pin number to position (column in table) mapping,
(2) Input and expected output values,
(3) A determination of whether to test the output values, and (4) A mechanism for handling repeated lines (the REPEAT instruction). This could be accomplished by replicating the lines the required number of times, when the target simulator lacks a REPEAT instruction. More advanced test devices might include commands such as APPLY test pattern, TEST expected output and REPEAT specific lines in test program.

Figures 5, 6:
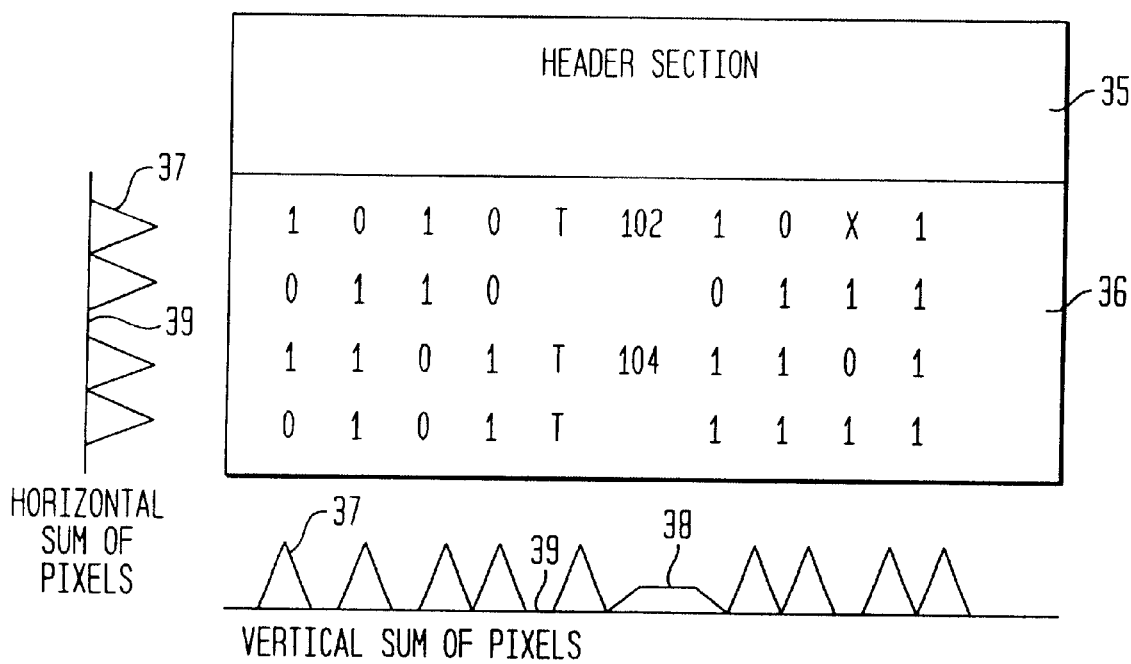
FIG. 5 is an illustration of a formatted test vector file generated from a test pattern drawing using the present invention.
FIG. 6 illustrates a method of locating test pattern symbols according to another preferred embodiment of the present invention.

FIG. 5 shows an example of a test pattern drawing that has actually been converted into a formatted text file. The format chosen for this particular text file was the same as the format used in the original test pattern drawing. This file can be used as input to a CAD simulation, where the simulator controls the reading of each test vector, applies the inputs to the simulation model, and checks the model's response with the output response specified in the test pattern drawing. Depending on the requirements of a particular CAD simulator or IC tester, this file could be produced in a number of different formats, any one of which would contain the same basic information.

Referring again to FIG. 5, this demonstrates a working prototype of the method of the present invention, and can be compared with FIGS. 1–3. In FIG. 5, the 0's and 1's indicate input stimuli values from the input pins for the test line. The L, H, and X entries indicate expected output values on the output pins, where an L value exceeds 0, an H value exceeds 1 and an X value is used where it is immaterial if the observed value is 0 or 1. In FIG. 5, each line of that table is a complete input and output pattern, providing the same information as a line across FIGS. 1–3. The use of these characters is a standard practice within the CAD field For computational efficiency, the "white" areas of the drawing (i.e., the areas represented by white pixels in the bitmap image) can be located and removed from consideration prior to any of the recognition steps. The white areas do not contain information, yet typically consume 50 to 80 percent of the drawing area. Upon completion of each recognition step in the method of the present invention, those portions of the bitmap image that are located and identified can likewise be removed from consideration prior to each of the subsequent steps in an iterative manner. This is accomplished by changing the pixel values of the recognized symbols from black to white (i.e., from a logical "1" value to a logical "0" value). Each subsequent operation is then carried out, but only on the remaining unidentified portions of the drawing (i.e., on the remaining black pixels). This facilitates more efficient pattern recognition because processing time and memory requirements are reduced as a decreasing number of black pixels in the bitmap image are processed in each subsequent step in the process.

Symbol location information is derived for the recognized essential test pattern data by selecting a location reference point for each symbol. The location reference point includes both a horizontal and vertical component corresponding to one point for each symbol (e.g., the lower left pixel location). The symbols are typically large enough so that any noise in the horizontal or vertical directions will not be enough to place a symbol in the wrong row or column. The location reference point is stored in a tabular format of rows and columns, which correspond to the arrangement of essential test pattern data in the bitmap image. The correct placement of each symbol in the proper row and column is essential for the correct generation of the output file.

Because the text in test pattern drawings may be unformatted (as compared to a page of text), some refinements can be made to improve the performance of the symbol/character recognition process. For example, in another preferred embodiment of the present invention shown in FIG. 6, the bitmap image of the test pattern drawing is separated into two sections after the lines are removed. One of the sections comprises the header information and the other comprises the body of the data table. The header section 35 contains variable length, multi-character items with a greater symbol set than that used in the body section 36 of the test pattern drawing. The header section 35 can have any alphanumeric symbol, and the pin names may even contain spaces. To recognize the information in the header section, commonly used character recognition methods can be used as previously described.

For the body section 36, the tabular nature of the test pattern data is used to help locate the test pattern symbols. Illustratively, the sum of all of the pixel values in the body section 36 are calculated, both horizontally and vertically, thus resulting in areas of large value 37, separated by and relative to areas of small value 38 and areas of zero value 39. By locating the areas of large, small, and zero value, 37, 38, and 39 respectively, the horizontal and vertical sums of pixels are used to accurately identify the rows and columns of test pattern data for further processing. The row/column intersections are then searched with a pixel mask to identify the specific black pixels at that location. Recognition of the character at that location is then carried out, but only on the reduced set of black pixels.

Although the present invention has been described with regard to a single method according to the present invention, those skilled in the art will readily recognize that other variations of performing this method are also possible. Accordingly, the inventors do not wish to be limited by the present specification, but only by the appended claims.

We claim:

1. A computer implemented method for generating test vector files from test pattern drawings for computer-aided design and integrated circuit testing tools, comprising the steps of:

producing a bitmap image of a test pattern drawing having a plurality of rows and columns of test pattern data, wherein the bitmap image comprises a plurality of black and white pixels and wherein the test pattern data comprises testing characteristics of a circuit or component;

locating and removing non-essential drawing symbols from the bitmap image;

recognizing essential test pattern information from the bitmap image; and converting the essential test pattern information into said test vector files in a machine-readable file format.

2. The method of claim 1 wherein the step of recognizing essential test pattern information comprises the steps of:

locating and identifying column headings in the bitmap image, wherein the column headings include integrated circuit identification information;

locating and identifying input and output data in the plurality of rows and columns of the test pattern data;

locating and identifying line numbers in the bitmap image, wherein each of the line numbers corresponds to a row of test pattern data and provides the sequencing for the test pattern data;

locating and identifying a test indicator symbol in the bitmap image, wherein the test indicator symbol identifies the output data in the test pattern data to be verified by the computer-aided design and integrated circuit testing tools; and locating and identifying special test commands in the bitmap image.

3. The method of claim 2, wherein the step of locating and identifying input and output data in the plurality of rows and columns of the test pattern data further comprises:
storing the input and output data and corresponding location information;
identifying physical boundaries of the test pattern data in the bitmap image;
identifying a missing entry within the rows and columns of the test pattern data, wherein the missing entry represents an unchanged signal value over a range of test patterns; and
reconciling the missing entry in the test pattern data.

4. The method of claim 3 wherein the missing entry is reconciled by back-filling the respective intervening value.

5. The method of claim 2 wherein the step of locating and identifying special test commands includes locating and identifying a repeat test instruction linked to at least one line number, wherein the row of test pattern data corresponding to the linked line number is to be repeatedly tested.

6. The method of claim 5 wherein the repeat test instruction comprises a bracket symbol of larger size relative to other symbols in the essential test pattern data, the bracket symbol having a pair of end points for identifying the line number of the test pattern to be repeated, the repeat test instruction further comprising a text label and a number representing the number of times for the test pattern to be repeated.

7. The method of claim 6 wherein the bracket symbol is located and identified by differentiating between symbol sizes of the test pattern data.

8. The method of claim 6 wherein black pixels of previously located and identified test pattern data are converted into white pixels, the bracket symbol being subsequently located and identified by searching the remaining black pixels to detect the pair of end points.

9. The method of claim 2 further comprising the steps of:
prior to the recognizing step, locating and removing portions of the bitmap image having white pixels;
changing the pixel values of the essential test pattern information located and identified in the recognizing step from black to white, wherein the black pixel has a logical "1" value and the white pixel has a logical "0" value;
iteratively removing the white pixels from the bitmap image upon completion of each locating and identifying step;
wherein each subsequent step of locating and identifying essential test pattern information is performed on a decreasing number of black pixels in the bitmap image.

10. The method of claim 1 wherein the step of converting the essential test pattern information into a machine-readable file format comprises the steps of:
storing the recognized essential test pattern information in a tabular data format having rows and columns which correspond to the rows and columns of the test pattern data in the bitmap image;
generating a machine-readable file format adaptable to the computer-aided design and integrated circuit testing tools; and
integrating the stored essential test pattern information with the machine-readable file format to generate the test vector file.

11. The method of claim 10 wherein the step of storing the recognized essential test pattern information includes storing symbol identification information and symbol location information.

12. The method of claim 11 wherein symbol location information for the recognized essential test pattern information is derived by:
selecting a location reference point for each recognized symbol in the essential test pattern information, wherein the location reference point comprises a horizontal and vertical component corresponding to a lower left pixel location of the symbol; and
storing the location reference point for each symbol in a tabular arrangement of rows and columns, wherein the rows and columns correspond to the arrangement of the test pattern data in the bitmap image.

13. The method of claim 1 wherein the non-essential drawing symbols include vertical and horizontal lines defining a data table in the bitmap image, wherein the vertical and horizontal lines are defined by black pixels.

14. The method of claim 13 wherein the vertical and horizontal lines are removed by replacing the black pixels with white pixels.

15. The method of claim 14 further comprising the steps of:
separating the bitmap image into a header and body section after the vertical and horizontal lines are removed;
wherein the header section comprises variable length, multi-character items with a greater symbol set relative to the body section, the essential test pattern data being located and identified in the header section by character recognition;
wherein the body section comprises a tabular format including a plurality of rows and columns of test pattern data, the rows and columns jointly defining a plurality of intersections, the essential test pattern information being located and identified in the body section by:
calculating the sum of horizontal and vertical pixel values of the respective rows and columns, wherein the horizontal and vertical pixel sums define areas of large value separated by and relative to areas of zero and small value;
identifying the rows and columns of essential test pattern information by locating the areas of large, small, and zero value;
searching the intersections with a pixel mask to identify the black pixels at the intersection location; and
locating and identifying essential test pattern information from a reduced set of black pixels by character recognition.

16. A computer implemented method for generating test vector files from test pattern drawings for computer-aided design and integrated circuit testing tools, comprising the steps of:
producing a bitmap image of a test pattern drawing having a plurality of rows and columns of test pattern data, wherein the bitmap image comprises a plurality of black and white pixels;
locating and removing non-essential drawing symbols from the bitmap image;
recognizing essential test pattern information from the bitmap image by:
locating and identifying column headings in the bitmap image, wherein the column headings include integrated circuit identification information;
locating and identifying input and output data in the plurality of rows and columns of the test pattern data;
locating and identifying line numbers in the bitmap image, wherein each of the line numbers corresponds to a row of test pattern data and provides the sequencing for the test pattern data;

locating and identifying a test indicator symbol in the bitmap image, wherein the test indicator symbol identifies the output data in the test pattern data to be verified by the computer-aided design and integrated circuit testing tools;

locating and identifying special test commands in the bitmap image; and converting the essential test pattern information into a machine-readable file format.

17. The method of claim 16 wherein the step of locating and identifying input and output data in the plurality of rows and columns of the test pattern data further comprises:

storing the input and output data and corresponding location information;

identifying physical boundaries of the test pattern data in the bitmap image;

identifying a missing entry within the rows and columns of the test pattern data wherein the missing entry represents an unchanged signal value over a range of test patterns; and reconciling the missing entry in the test pattern data.

18. The method of claim 17 wherein the missing entry is reconciled by back-filling the respective intervening value.

19. The method of claim 16 wherein the step of locating and identifying special test commands includes locating and identifying a repeat test instruction linked to at least one line number, wherein the row of test pattern data corresponding to the linked line number is to be repeatedly tested.

20. The method of claim 19 wherein the repeat test instruction comprises a bracket symbol of larger size relative to other symbols in the essential test pattern data, the bracket symbol having a pair of end points for identifying the line number of the test pattern to be repeated, the repeat test instruction further comprising a test label and a number representing the number of times for the test pattern to be repeated.

21. The method of claim 20 wherein the bracket symbol is located and identified by differentiating between symbol sizes of the test pattern data.

22. The method of claim 20 wherein black pixels of previously located and identified test pattern data are converted into white pixels, the bracket symbol being subsequently located and identified by searching the remaining black pixels to detect the pair of end points.

23. The method of claim 16 further comprising the steps of:

prior to the recognizing step, locating and removing portions of the bitmap image having white pixels;

changing the pixel values of the essential test pattern information located and identified in the recognizing step from black to white, wherein the black pixel has a logical "1" value and the white pixel has a logical "0" value;

iteratively removing the white pixels from the bitmap image upon completion of each locating and identifying step;

wherein each subsequent step of locating and identifying essential test pattern information is performed on a decreasing number of black pixels in the bitmap image.

24. A computer implemented method for generating test vector files from test pattern drawings for computer-aided design and integrated circuit testing tools, comprising the steps of:

producing a bitmap image of a test pattern drawing having a plurality of rows and columns of test pattern data, wherein the bitmap image comprises a plurality of black and white pixels;

locating and removing non-essential drawing symbols from the bitmap image;

recognizing essential test pattern information from the bitmap image; and converting the essential test pattern information into a machine-readable file format by:

storing the recognized essential test pattern information in a tabular data format having rows and columns which correspond to the rows and columns of the test pattern data in the bitmap image;

generating a machine-readable file format adaptable to the computer-aided design and integrated circuit testing tools; and integrating the stored essential test pattern information with the machine-readable file format to generate the test vector file.

25. The method of claim 24 wherein the step of storing the recognized essential test pattern information includes storing symbol identification information and symbol location information.

26. The method of claim 25 wherein symbol location information for the recognized essential test pattern information is derived by:

selecting a location reference point for each recognized symbol in the essential test pattern information, wherein the location reference point comprises a horizontal and vertical component corresponding to a lower left pixel location of the symbol; and storing the location reference point for each symbol in a tabular arrangement of rows and columns, wherein the rows and columns correspond to the arrangement of the test pattern data in the bitmap image.

27. A computer implemented method for, generating test vector files from test pattern drawings for computer-aided design and integrated circuit testing tools, comprising the steps of:

producing a bitmap image of a test pattern drawing having a plurality of rows and columns of test pattern data, wherein the bitmap image comprises a plurality of black and white pixels;

locating and removing non-essential drawing symbols from the bitmap image, with the non-essential drawing symbols being inclusive of vertical and horizontal lines defining a data table in the bitmap image and wherein the vertical and horizontal lines are defined by black pixels which are replaced by white pixels;

separating the bitmap image into a header and body section after the vertical and horizontal lines are removed;

wherein the header section comprises variable length, multi-character items with a greater symbol set relative to the body section, the essential test pattern data being located and identified in the header section by character recognition;

wherein the body section comprises a tubular format including a plurality of rows and columns of test pattern data, the rows and columns jointly defining a plurality of intersections, the essential test pattern information being located and identified in the body section by:

calculating the sum of horizontal and vertical pixel values of the respective rows and columns, wherein the horizontal and vertical pixel sums define areas of large value separated by and relative to areas of zero and small value;

identifying the rows and columns of essential test pattern information by locating the areas of large, small, and zero value;

searching the intersections with a pixel mask to identify the black pixels at the intersection location;

locating and identifying essential test pattern information from a reduced set of black pixels by character recognition;

recognizing essential test pattern information from the bitmap image; and converting the essential test pattern information into a machine-readable file format.

* * * * *